(12) United States Patent
Parfitt et al.

(10) Patent No.: US 11,824,535 B2
(45) Date of Patent: Nov. 21, 2023

(54) FAIL-SAFE COUNTER EVALUATOR TO INSURE PROPER COUNTING BY A COUNTER

(71) Applicant: Siemens Industry, Inc., Alpharetta, GA (US)

(72) Inventors: Steven Parfitt, Johnson City, TN (US); Steven M. Hausman, Johnson City, TN (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 580 days.

(21) Appl. No.: 17/251,467

(22) PCT Filed: Jul. 11, 2018

(86) PCT No.: PCT/US2018/041653
§ 371 (c)(1),
(2) Date: Dec. 11, 2020

(87) PCT Pub. No.: WO2020/013819
PCT Pub. Date: Jan. 16, 2020

(65) Prior Publication Data
US 2021/0258012 A1 Aug. 19, 2021

(51) Int. Cl.
*H03K 21/40* (2006.01)
*G01R 31/3185* (2006.01)

(52) U.S. Cl.
CPC ... *H03K 21/406* (2013.01); *G01R 31/318527* (2013.01)

(58) Field of Classification Search
CPC ............... H03K 21/40; H03K 21/406; G01R 31/318527
See application file for complete search history.

(56) References Cited

U.S. PATENT DOCUMENTS 4,189,635 A * 2/1980 Sheller .......... G01R 31/318527
377/29
4,373,201 A 2/1983 Bohan, Jr.
(Continued)

FOREIGN PATENT DOCUMENTS

| JP | S5528636 A | 2/1980 | |
| JP | 3980203 B2 * | 9/2007 | ............. H03K 21/40 |

OTHER PUBLICATIONS

PCT International Search Report and Written Opinion of International Searching Authority dated Mar. 21, 2019 corresponding to PCT International Application No. PCT/US2018/041653 filed Jul. 11, 2018.

*Primary Examiner* — Patrick O Neill

(57) ABSTRACT

A fail-safe counter evaluator is provided to insure proper counting operations by fail-safe counters. The failsafe counter evaluator comprises a first microprocessor, a first counter, a second counter, a second microprocessor and a test channel. The first counter is configured as a counter in operation and disposed in the first microprocessor to receive externally generated count pulses. The second counter is disposed in the first microprocessor and configured to undergo a test. The test channel is configured to send an input test signal to the second counter based on test pulses from the second microprocessor. The first microprocessor and the second microprocessor are synchronized so that to coordinate a start and an end of the test. The second counter is evaluated after the test pulses have been sent to determine if the second counter is operating properly.

20 Claims, 5 Drawing Sheets

(56) References Cited

U.S. PATENT DOCUMENTS

2008/0165913 A1    7/2008   Roquelaure
2012/0166880 A1    6/2012   Greb et al.

\* cited by examiner

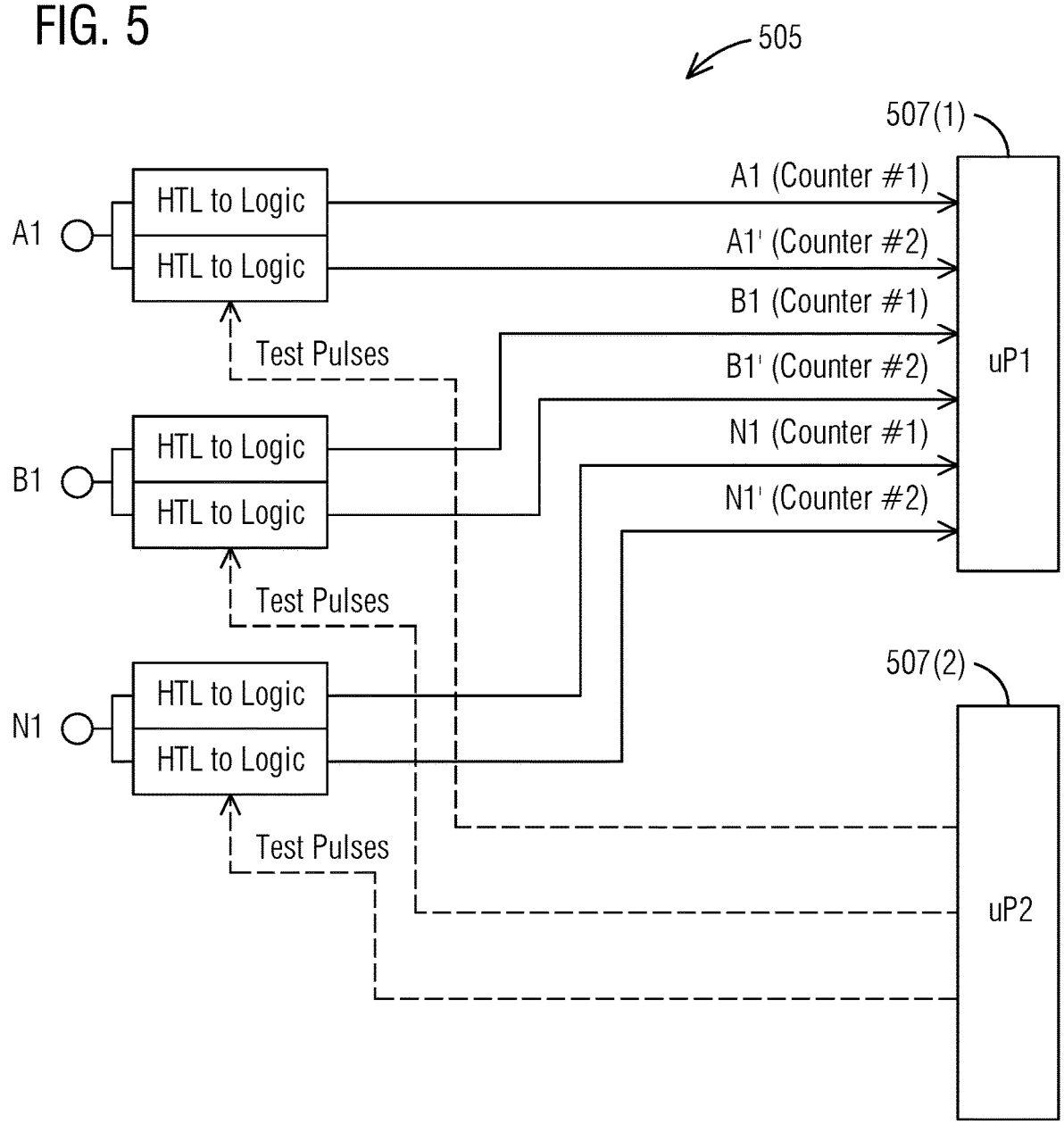

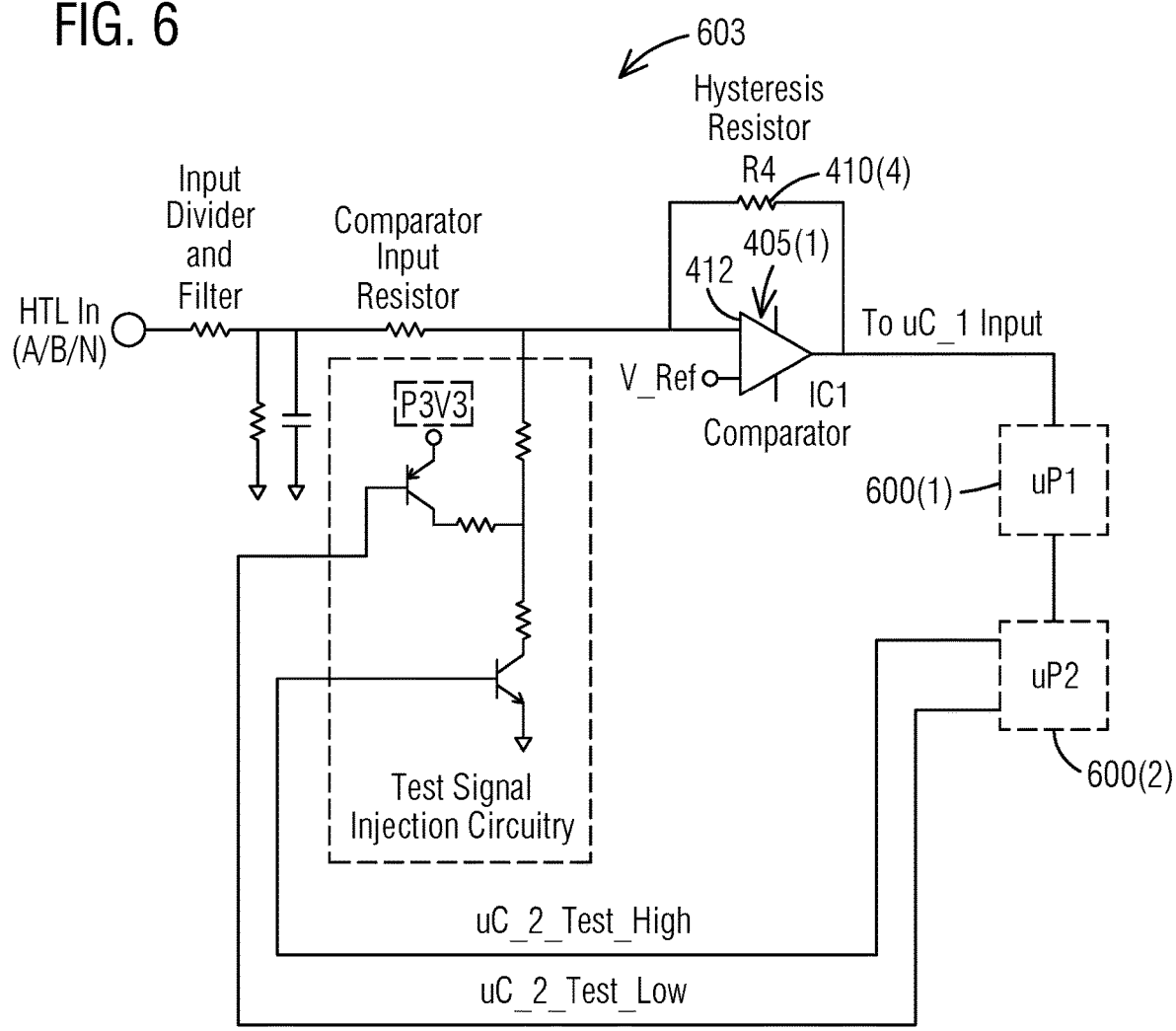

FAIL-SAFE COUNTER EVALUATOR TO INSURE PROPER COUNTING BY A COUNTER

BACKGROUND

1. Field

Aspects of the present invention generally relate to a fail-safe counter evaluator for evaluating counters to ensure proper counting operations by a counter.

2. Description of the Related Art

A counter can be used to count up or count down in numbers. A counter circuit is usually constructed of a number of flip-flops connected in cascade or in software code. Counters are a very widely used component in digital circuits, and are manufactured as separate integrated circuits and also incorporated as parts of larger integrated circuits.

A "fail-safe" term in engineering means a design feature or a practice that in the event of a specific type of failure, inherently responds in a way that will cause no or minimal harm to other equipment, the environment or to people. A system being "fail-safe" does not mean that failure is impossible or improbable, but rather that the system's design prevents or mitigates unsafe consequences of the system's failure. Fail-safe means that a device will not endanger lives or property when it fails.

A control operation or function that prevents improper system functioning or catastrophic degradation in the event of circuit malfunction or operator error; for example, a fail-safe counter used to control operational signals. Fail-safe counters must be evaluated to insure proper counting (no missed counts/no extraneous counts) of the hardware and software. Extraneous pulses would also constitute a failure in the count.

Therefore, there is an immediate need for a manner in which counters are tested for their proper operation.

SUMMARY

Briefly described, aspects of the present invention relate to a fail-safe counter evaluator to evaluate fail-safe counters to insure proper counting (no missed counts/no extraneous counts) of the hardware and software. Extraneous pulses would also constitute a failure in the count. In this way, fail-safe counters are tested for proper operation. A "fail-safe" counter prevents or mitigates unsafe consequences of a system's failure as a counter operation or function prevents improper system functioning or catastrophic degradation in an event of malfunction or operator error. By using two counters (a and b) with a first counter (a) driven by an input to be counted while a second counter (b) is sent test pulses for evaluation. The second counter (b) is evaluated after the test pulses have been sent to determine if the second counter is operating properly.

In accordance with one illustrative embodiment of the present invention, a fail-safe counter evaluator is provided to ensure proper counting operations by fail-safe counters. The failsafe counter evaluator comprises a first microprocessor and a first counter that is configured as a counter in operation and disposed in the first microprocessor to receive externally generated count pulses. The failsafe counter evaluator further comprises a second counter that is disposed in the first microprocessor and configured to undergo a test. The fail-safe counter evaluator further comprises a second microprocessor and a test channel that is configured to send an input test signal to the second counter based on test pulses from the second microprocessor. The second microprocessor is configured to inject the input test signal to the second counter of the first microprocessor being the counter under test such that the first microprocessor and the second microprocessor are synchronized so that to coordinate a start and an end of the test. The first counter is driven by the externally generated count pulses to be counted while the second counter is sent the test pulses for evaluation such that the second counter is evaluated after the test pulses have been sent to determine if the second counter is operating properly.

In accordance with one another illustrative embodiment of the present invention, a fail-safe counter evaluator is being provided to insure proper counting operations by fail-safe counters. The fail-safe counter evaluator comprises a first microprocessor that is configured to provide internally generated test pulses for evaluating counters to insure proper counting operations. The fail-safe counter evaluator additionally comprises a test channel that has been configured to send an input test signal based on the test pulses from the first microprocessor. The fail-safe counter evaluator even further comprises a second microprocessor and a second counter that is configured as a counter under test and disposed in the second microprocessor. The fail-safe counter evaluator yet additionally comprises a first counter that is disposed in the second microprocessor and configured to count externally generated count pulses. The first microprocessor is configured to inject the input test signal to the second counter being the counter under test such that the first microprocessor and the second microprocessor are synchronized so that to coordinate a start and an end of the test. The first counter is driven by the externally generated count pulses to be counted while the second counter is sent the test pulses for evaluation such that the second counter is evaluated after the test pulses have been sent to determine if the second counter is operating properly.

BRIEF DESCRIPTION OF THE DRAWINGS

FIG. 5 illustrates a first channel of a fail-safe counter evaluator where a microprocessor one (uP1) is receiving inputs and generating a counter output while a microprocessor two (uP2) generates test pulses and performs evaluations and for a second channel the microprocessor one (uP1) would generate test pulses and perform evaluations while the microprocessor two (uP2) would receive inputs and generate a counter output in accordance with an exemplary embodiment of the present invention.

FIG. 6 illustrates a simplified schematic of a fail-safe counter evaluator with a microprocessor one (uP1) receiving an input (A/B/N) while a microprocessor two (uP2) generates test pulses and performs evaluations in accordance with an exemplary embodiment of the present invention.

DETAILED DESCRIPTION

To facilitate an understanding of embodiments, principles, and features of the present invention, they are explained hereinafter with reference to implementation in illustrative embodiments. In particular, they are described in the context of a fail-safe counter evaluator that is configured to test fail-safe counters to ensure proper counting operations therein (no missed counts). Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

By using two counters (a and b) with a first counter (a) driven by an input to be counted while a second counter (b) is sent test pulses for evaluation. The second counter (b) is evaluated after the test pulses have been sent to determine if the second counter is operating properly. Once the second counter (b) has been determined to be working properly it is configured to receive the same inputs as the first counter (a). The count from the active counter (a) is transferred to the tested counter (b) and verified to contain the same count. When both counters are thus synchronized, the first counter (a) is removed from counting and driven with test pulses to insure it counts properly while the second counter (b) performs the counting function. Once the first counter (a) has been evaluated, the counters are again synchronized and the first counter (a) is again used for counting while the second counter (b) is evaluated. In this manner, both the first and the second counters are tested for a proper operation in an alternate fashion while one counter is always performing the required counting function.

Figure 1:
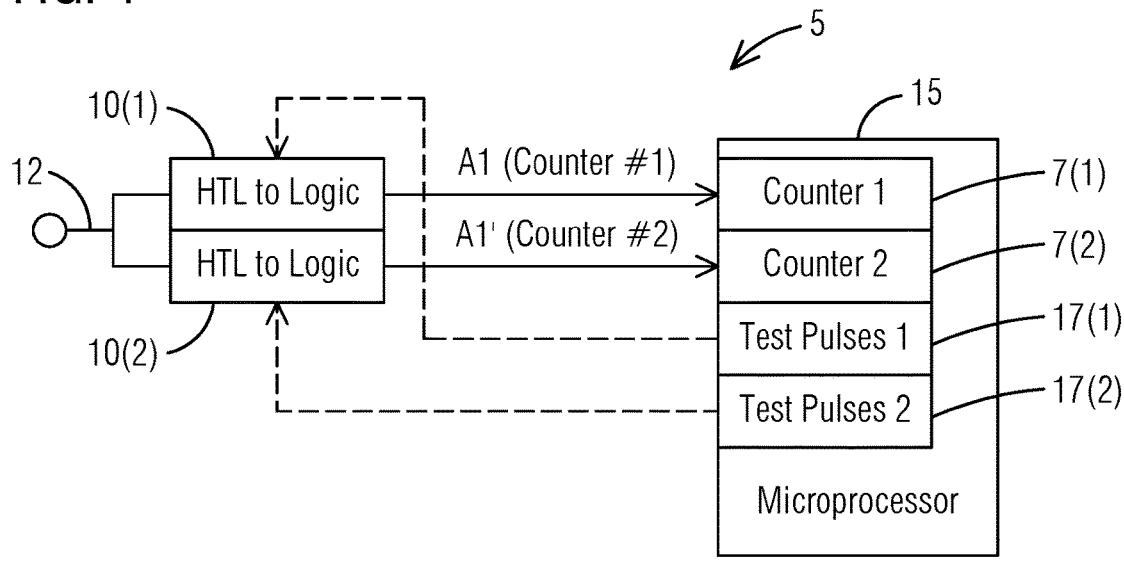
FIG. 1 illustrates a representation of a simple fail-safe counter evaluator to test fail-safe counters to insure proper counting operations (no missed counts) in accordance with an exemplary embodiment of the present invention.

Consistent with one embodiment of the present invention, FIG. 1 represents a simple fail-safe counter evaluator 5 configured to test two fail-safe counters, i.e., first and second fail-safe counters 7(1-2) to insure proper counting operations (no missed counts) in accordance with an exemplary embodiment of the present invention. The fail-safe counter evaluator 5 allows for evaluation of the first and second fail-safe counters 7(1-2) in real-time to insure that they are performing a proper counting function without losing counts due to defects in a counter. While the first and second fail-safe counters 7(1-2) counters could be driven by a same input and the count results could be compared against each other, this technique would not detect common faults shared by the first and second fail-safe counters 7(1-2) counters.

An example of possible implementation of the fail-safe counter evaluator 5 with two High Threshold Logic (HTL) to logic blocks 10(1-2) which convert an external signal 12 level to a level compatible with a counter logic which may be part of one or more microprocessors, discrete logic counters, counters implemented in an Application Specific Integrated Circuit (ASIC), other technology, or counting functions. The High Threshold Logic (HTL) to logic blocks 10(1-2) has the ability to manipulate the first and second fail-safe counters 7(1-2) and their resulting count. High Threshold Logic (HTL) is a variant of diode-transistor logic which is used in such environments where noise is very high.

The fail-safe counter evaluator 5 comprises a microprocessor (uP) 15. The first and second fail-safe counters 7(1-2) may be part of the microprocessor (uP) 15. The fail-safe counter evaluator 5 further comprises a first test pulse generator 17(1) and a second test pulse generator 17(2). The first counter 7(1) is enabled for counting external events such as a count pulse A1. The second counter 7(2) is enabled for counting external events such as a count pulse A1'. But first one of the counter blocks, the second counter 7(2) is disabled from counting external events, and is enabled for counting 'test pulses" generated by the first test pulse generator 17(1) of the microprocessor (uP) 15. The output of the first test pulse generator 17(1) is coupled to the High Threshold Logic (HTL) to logic block 10(1). The output of the second test pulse generator 17(2) is coupled to the High Threshold Logic (HTL) to logic block 10(2).

The count of the second fail-safe counter 7(2) is evaluated to determine if a correct number of test pulses have been counted and if so the second fail-safe counter 7(2) is functioning properly. Upon determination that the second fail-safe counter 7(2) is functioning properly, the second fail-safe counter 7(2) is switched to counting external events, and the count contained in the first fail-safe counter 7(1) is copied to the second fail-safe counter 7(2). Both counters (7-12) now are synchronized and they are compared to verify their synchronization status. Once both the counters (7-12) are synchronized and contain the same count, the first fail-safe counter 7(1) can be switched to counting internally generated "test pulses" and evaluated for proper operation while the second fail-safe counter 7(2) is counting externally generated events. The fail-safe counter evaluator 5 is not limited to a single event counting, but may be readily extended to "Up/Down" counting, "Counting with Direction signal", "Incremental Encoder" counting and other counting formats.

Figure 2:
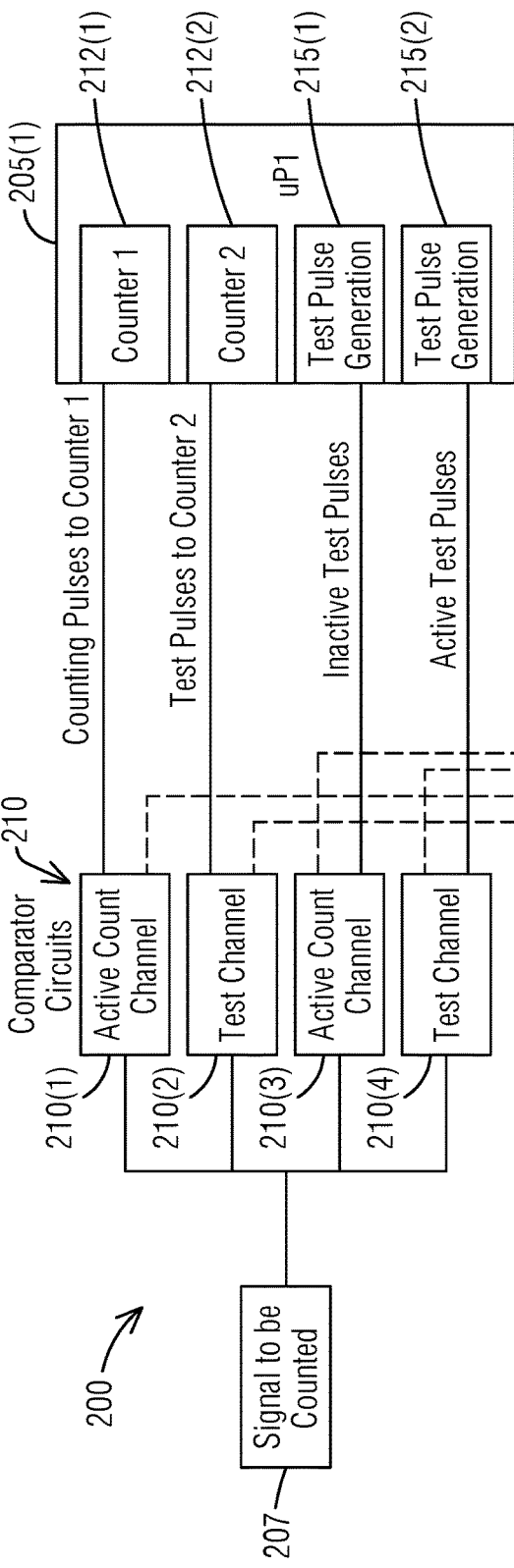
FIG. 2 illustrates a representation of a one channel fail-safe counter evaluator in which a microprocessor one (uP1) is receiving inputs and generating a counter output while a microprocessor two (uP2) generates test pulses and performs evaluations in accordance with an exemplary embodiment of the present invention.

Referring to FIG. 2, it illustrates a representation of a one channel fail-safe counter evaluator 200 in which a microprocessor one (uP1) 205(1) is receiving inputs and generating a counter output while a microprocessor two (uP2) 205(2) generates test pulses and performs evaluations in accordance with an exemplary embodiment of the present invention. The one channel fail-safe counter evaluator 200 receives a signal 207 to be counted at a plurality of comparator circuits 210 including a first active count channel 210(1), a first test channel 210(2), a second active count channel 210(3), and a second test channel 210(4). The microprocessor one (uP1) 205(1) comprises a first fail-safe counter 212(1) and a second fail-safe counter 212(2). The microprocessor one (uP1) 205(1) further comprises a first test pulse generator 215(1) and a second test pulse generator 215(2). The microprocessor two (uP2) 205(2) comprises a third fail-safe counter 212(3) and a fourth fail-safe counter 212(4). The microprocessor two (uP2) 205(2) further comprises a third test pulse generator 215(3) and a fourth test pulse generator 215(4). An inter-processor communications interface 217 couples the microprocessor one (uP1) 205(1) and the microprocessor two (uP2) 205(2).

In operation, the first active count channel 210(1) provides "counting pulses" to the first fail-safe counter 212(1). The first test channel 210(2) provides "test pulses" to the second fail-safe counter 212(2). The first test pulse generator 215(1) provides "inactive test pulses" to the second active count channel 210(3). The second test pulse generator 215(2) provides "active test pulses" to the second test channel 210(4). The second active count channel 210(3) provides "counting pulses" to the third fail-safe counter 212(3). The second test channel 210(4) provides "test pulses" to the fourth fail-safe counter 212(4). The third test pulse generator 215(3) provides "inactive test pulses" to the first active count channel 210(1). The fourth test pulse generator 215(4) provides "active test pulses" to the first test channel 210(2).

The one channel fail-safe counter evaluator 200 insures proper counting of the first fail-safe counter 212(1) and the second fail-safe counter 212(2) either via only the microprocessor one (uP1) 205(1) or using the inter-processor communications interface 217 that couples the microprocessor one (uP1) 205(1) and the microprocessor two (uP2) 205(2) based on a particular configuration of counter arrangement in a set-up. The one channel fail-safe counter evaluator 200 ensures proper counting of the third fail-safe counter 212(3) and the fourth fail-safe counter 212(4) either via only the microprocessor two (uP2) 205(2) or using the inter-processor communications interface 217 that couples the microprocessor one (uP1) 205(1) and the microprocessor two (uP2) 205(2) based on a particular configuration of counter arrangement in a set-up.

The first fail-safe counter 212(1) is configured as a counter in operation and disposed in the microprocessor one (uP1) 205(1) to receive externally generated count pulses. The second fail-safe counter 212(2) is disposed in the microprocessor one (uP1) 205(1) and configured to undergo a test. The first test channel 210(2) is configured to send an input test signal to the second fail-safe counter 212(2) based on test pulses from the microprocessor two (uP2) 205(2). The microprocessor two (uP2) 205(2) is configured to inject the input test signal to the second fail-safe counter 212(2) of the microprocessor one (uP1) 205(1) being the counter under test such that the microprocessor one (uP1) 205(1) and the microprocessor two (uP2) 205(2) are synchronized so that to coordinate a start and an end of the test. The first fail-safe counter 212(1) is driven by the externally generated count pulses to be counted while the second fail-safe counter 212(2) is sent the test pulses for evaluation such that the second fail-safe counter 212(2) is evaluated after the test pulses have been sent to determine if the second fail-safe counter 212(2) is operating properly.

Once the second fail-safe counter 212(2) has been determined to be working properly the second fail-safe counter 212(2) is configured to receive same inputs as the first fail-safe counter 212(1) such that a count from the first fail-safe counter 212(1) being an active counter is transferred to the second fail-safe counter 212(2) being a tested counter and the count is verified to contain a same count. When both the first and second counters 212(1-2) are synchronized, the first fail-safe counter 212(1) is removed from counting and driven with test pulses to insure the first fail-safe counter 212(1) counts properly while the second fail-safe counter 212(2) performs a counting function.

Once the first fail-safe counter 212(1) has been evaluated, the first and second counters 212(1-2) are again synchronized and the first fail-safe counter 212(1) is again used for counting while the second fail-safe counter 212(2) is evaluated. Both the first and second counters 212(1-2) are tested for proper operation in an alternate fashion while one counter is always performing a required counting function.

The one channel fail-safe counter evaluator 200 is configured to perform an evaluation of the first and second counters 212(1-2) in real-time to insure that the first and second counters 212(1-2) are performing a proper counting function without losing counts due to defects in the first and second counters 212(1-2). The first fail-safe counter 212(1) is enabled for counting external events and the second fail-safe counter 212(2) is disabled from counting external events and counts the test pulses generated by the microprocessor two (uP2) 205(2). A count of the second fail-safe counter 212(2) is evaluated to determine if a correct number of the test pulses have been counted and if so the second fail-safe counter 212(2) is determined to be functioning properly.

Upon determination that the second fail-safe counter 212(2) is functioning properly, the second fail-safe counter 212(2) is switched to counting external events, and a count contained in the first fail-safe counter 212(1) is copied to the second fail-safe counter 212(2) such that both the first and second counters 212(1-2) are synchronized and then compared to verify the count. Once both the first and second counters 212(1-2) are synchronized and contain a same count, the first fail-safe counter 212(1) is switched to counting the test pulses and evaluated for a proper operation while the second fail-safe counter 212(2) is switched to counting the external events.

The test pulses may be generated by the microprocessor one (uP1) 205(1) instead of the microprocessor two (uP2) 205(2) or vice versa depending upon a testing set-up. During a test counter inputs are effectively disconnected from physical inputs and the microprocessor one (uP1) 205(1) injects the test pulses into the third fail-safe counter 212(3) of the microprocessor two (uP2) 205(2) being under test. The injected test pulses mimic a quadrature counter so that the first fail-safe counter 212(1) being under test is tested in an actual input mode. The first and second microprocessors 205(1-2) are configured to communicate to ensure that a number of injected test pulses are accurately counted by the first fail-safe counter 212(1) being under test. If the injected test pulses are not counted correctly a failure is indicated in the first fail-safe counter 212(1) being under test or in an input circuitry and the one channel fail-safe counter evaluator 200 goes to a safe failure mode.

Figure 3:
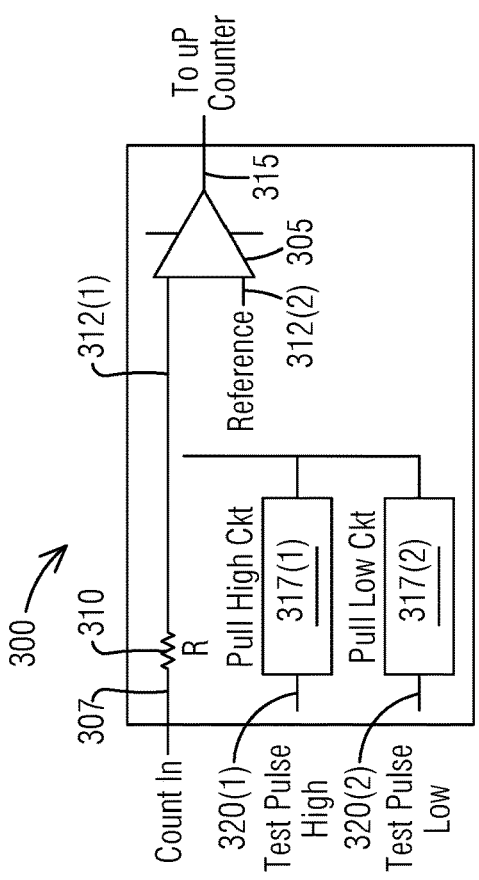
FIG. 3 illustrates details of a comparator circuit in accordance with an exemplary embodiment of the present invention.

Turning now to FIG. 3, it illustrates details of a comparator circuit 300 in accordance with an exemplary embodiment of the present invention. The comparator circuit 300 includes an operational amplifier (often op-amp or opamp) 305. The op-amp 305 receives a "count in" input 307 via a resistor 310 at a first terminal 312(1) to provide an output 315 to a fail-safe counter located into a microprocessor. The op-amp 305 on a second terminal 312(2) receives a reference voltage. The op-amp 305 may be a DC-coupled high-gain electronic voltage amplifier with a differential input and a single-ended output. In this configuration, the op-amp 305 produces an output potential (relative to circuit ground) that is typically hundreds of thousands of times larger than the potential difference between its input terminals.

The comparator circuit 300 further includes a pull high circuit 317(1) and a pull low circuit 317(2). The pull high circuit 317(1) receives a test pulse high 320(1) input. The pull low circuit 317(2) receives a test pulse low 320(2) input. The outputs of the pull high circuit 317(1) and the pull low circuit 317(2) connect to the first terminal 312(1) of the op-amp 305.

Figure 4:
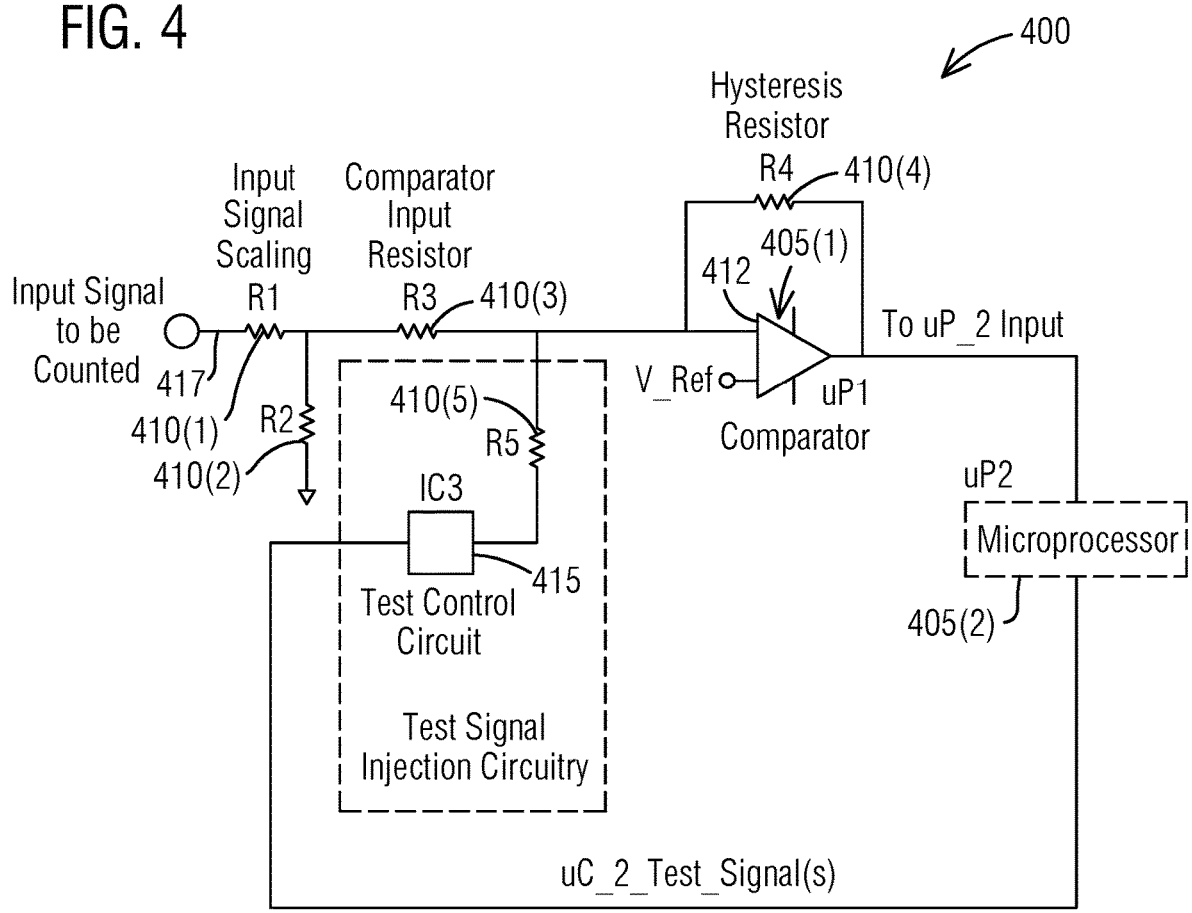
FIG. 4 illustrates a simplified fail-safe counter evaluator with a microprocessor one (uP1) receiving an input signal to be counted while a microprocessor two (uP2) generates test pulses and performs evaluations in accordance with an exemplary embodiment of the present invention.

FIG. 4 illustrates a simplified fail-safe counter evaluator 400 with a microprocessor one (uP1) 405(1) receiving an input signal 407 to be counted while a microprocessor two (uP2) 405(2) generates test pulses and performs evaluations in accordance with an exemplary embodiment of the present invention. The fail-safe counter evaluator 400 consists of resistors R1 410(1), R2 410(2), R3 410(3), R4 410(4), R5 410(5), and a comparator 412 being the microprocessor one (uP1) 405(1), a microprocessor being the microprocessor two (uP2) 405(2) and a test pulse control circuit 415.

The resistors R1 410(1) and R2 410(2) form a voltage divider to scale an input signal 417 to be counted to make it compatible with the voltage levels of the remaining circuits. It is possible that the fail-safe counter evaluator 400 could be used without R1 410(1) and R2 410(2), and it is also possible to replace R1 410(1) and R2 410(2) with an amplifier if the input signal 417 to be counted were too small to operate at the logic levels of a counting device. Typical examples of counting signal interface types include but are not limited to, High Threshold Logic (HTL), Sin/Cos, and RS422.

The resistors R3 410(3) and R4 410(4) form an input to the comparator 412 to convert the incoming input signal 417 into a clean signal for the microprocessor two (uP2) 405(2) to utilize for counting. The comparator 412 may be an amplifier, comparator, or it may be omitted if the voltage levels and speed of the incoming input signal 417 were compatible with signal requirements of a counter inside the microprocessor two (uP2) 405(2). The microprocessor two (uP2) 405(2) may be a microprocessor, ASIC, or another implementation of a counting function.

The resistor R3 410(3) in conjunction with the resistor R5 410(5) are used to inject counting signals into the counter under control of the microprocessor two (uP2) 405(2). The test pulse control circuit 415 represents switches to translate voltages from the microprocessor two (uP2) to provide proper levels to insert counting pulses to the input of the comparator 412. The test pulse control circuit 415 may be implemented as (1) a Discrete Transistor Circuit, (2) a Digital Logic circuit, (3) and Analog Switch circuit, (4) or other forms of electrical/electromechanical control. Two fail-safe counter circuits may used in conjunction with each other. One fail-safe counter circuit performs a counting function on the "input signal to be counted", while the second fail-safe counter circuit is being tested.

Testing is performed by the microprocessor two (uP2) 405(2) sending test pulses and control signals (if necessary) to the test pulse control circuit 415. The test pulse control circuit 415 injects the signals to the input of the comparator 412 where the pulses are compared to a reference level, producing high and low pulses for the counter.

A firmware may control the testing and synchronization of the multiple counters. The firmware may execute a test of the two counters at a specified interval based on any safety requirements of a system. The test only needs to be executed if the counter inputs are below a certain frequency, also determined by the safety requirements of the system. Above a certain frequency, the counter inputs do not need to be tested because the counts from the multiple counters can be compared to verify that the counters and inputs are functioning correctly.

There are multiple implementations possible ways to perform a counter test. One possible implementation involves two counters present in the same microprocessor two (uP2) 405(2). The test signals may be generated by the microprocessor two (uP2) 405(2) containing the two counters, or the test signals can be generated by an external device, i.e. a second microprocessor. Microprocessor one (uP1) contains the counter under test. The other microprocessor (uP2) conducts the test and injects signals to the counter under test. The two microprocessors are synchronized so that they coordinate the start and end of the test.

During the test, the counter inputs are effectively disconnected from the physical inputs and the other microprocessor (uC2) injects signals into the counter under test. The injected signals will mimic a quadrature counter so that the counter under test (uC1) is tested in the actual input mode. The two microprocessors will communicate to be sure that the number of injected test signals are accurately counted by the counter under test. If the test signals are not counted correctly, we assume that there is some failure in the counter under test or the input circuitry and the safety system will go to a safe failure mode.

During a test, a second counter in the microprocessor two (uP2) 405(2) will monitor the physical counter inputs to maintain a correct count. If the second counter being under test has the correct number of counts per the other microprocessor two (uP2) 405(2), the test is considered successful. The microprocessor two (uP2) 405(2) containing the counters will now synchronize the two counters. The counter under test will be set to the actual count that was maintained by the other counter in the microprocessor two (uP2) 405(2). The counts will be set and then verified to be sure the counters have the same count. This may need to be repeated several times to synchronize the counters. After the test is complete and the counters have been synchronized, the other microprocessor two (uP2) 405(2) is informed. The fail-safe counter evaluator 400 can now test any another counter if required.

As seen in FIG. 5, it illustrates a first channel of a fail-safe counter evaluator 505 where a microprocessor one (uP1) 507(1) is receiving inputs and generating a counter output while a microprocessor two (uP2) 507(2) generates test pulses and performs evaluations and for a second channel the microprocessor one (uP1) 507(1) would generate test pulses and perform evaluations while the microprocessor two (uP2) 507(2) would receive inputs and generate a counter output in accordance with an exemplary embodiment of the present invention. As shown in FIG. 6, it illustrates a simplified schematic of a fail-safe counter evaluator 603 with a microprocessor one (uP1) 600(1) receiving an input (A/B/N) while a microprocessor two (uP2) 600(2) generates test pulses and performs evaluations in accordance with an exemplary embodiment of the present invention.

Figure 7:
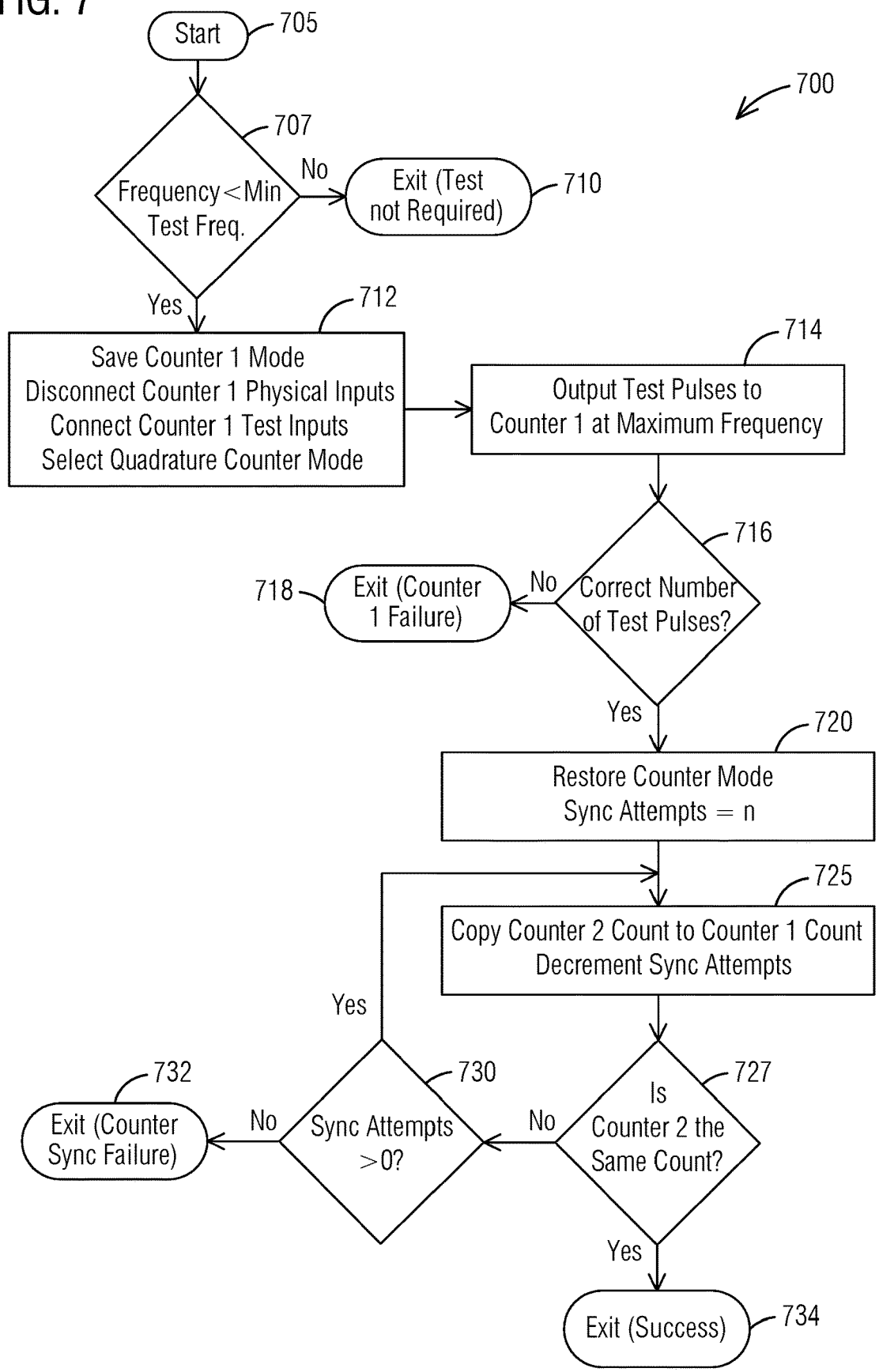
FIG. 7 illustrates a flow chart of a method of performing tests on each counter at a time interval determined by safety requirements if both counters are counting below a minimum frequency according to one exemplary embodiment of the present invention.

In FIG. 7, a flow chart illustrates a method 702 of performing tests on each counter at a time interval determined by safety requirements if both counters are counting below a minimum frequency according to one exemplary embodiment of the present invention. Reference is made to the elements and features described in FIGS. 1-6. It should be appreciated that some steps are not required to be performed in any particular order, and that some steps are optional.

At step 705, a test is started to determine whether a fail-safe counter is counting below a minimum frequency. At decision block 707, a check is made to determine whether a frequency of counting of the fail-safe counter is less than a minimum test frequency. If the answer in step 707 not affirmative, i.e., NO the test process stops in step 710 as the test is not required. If the answer in step 707 affirmative, i.e., YES the test process proceeds to step 712. In step 712, few actions occur including "save counter 1 mode," "disconnect counter 1 physical inputs," "connect counter 1 test inputs," and "select quadrature counter mode." Next in step 714, test pulses are output to counter 1 at a maximum frequency. Then at decision block 716, a check is made if there are a correct number of test pulses present. If the answer in step 716 not affirmative, i.e., NO the test process stops in step 718, indicating counter 1 failure. If the answer in step 716 affirmative, i.e., YES the test process proceeds to step 720. In step 720, few actions occur including "restore counter mode." The sync attempts are also set to "n" in this step 720.

At step 725, counter 2 count is copied to counter 1 count and the sync attempts are decremented. At decision block 727, a check is made to determine whether the counter 2 still has the same count. If the answer in step 727 not affirmative, i.e., NO the at decision block 730 a check is made if the sync attempts greater than "0." If the answer in step 730 affirmative, i.e., YES the test process proceeds to before step 725. If the answer in step 730 not affirmative, i.e., NO the test process exits in step 732 due to a counter sync failure. If the answer in step 727 affirmative, i.e., YES the test process exits in step 734 due to a success.

In accordance with one another illustrative embodiment of the present invention, a fail-safe counter evaluator is being provided to insure proper counting operations by fail-safe counters. The fail-safe counter evaluator comprises a first microprocessor that is configured to provide internally generated test pulses for evaluating counters to insure proper counting operations. The fail-safe counter evaluator additionally comprises a test channel that has been configured to send an input test signal based on the test pulses from the first microprocessor. The fail-safe counter evaluator even further comprises a second microprocessor and a second counter that is configured as a counter under test and disposed in the second microprocessor. The fail-safe counter evaluator yet additionally comprises a first counter that is disposed in the second microprocessor and configured to count externally generated count pulses. The first microprocessor is configured to inject the input test signal to the second counter being the counter under test such that the first microprocessor and the second microprocessor are synchronized so that to coordinate a start and an end of the test. The first counter is driven by the externally generated count pulses to be counted while the second counter is sent the test pulses for evaluation such that the second counter is evaluated after the test pulses have been sent to determine if the second counter is operating properly.

While a hardware type fail-safe counter is described here a range of one or more other types of fail-safe counters or other forms of counting function are also contemplated by the present invention. For example, other types of software fail-safe counters or other mixed-implementation fail-safe counters may be implemented based on one or more features presented above without deviating from the spirit of the present invention.

The techniques described herein can be particularly useful for fail-safe counters disposed in microprocessor(s). While particular embodiments are described in terms of the microprocessor(s), the techniques described herein are not limited to the microprocessor(s) but can also be used with other components—digital or analog, circuits or devices.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A failsafe counter evaluator to insure proper counting, the failsafe counter evaluator comprising:
   a first microprocessor;
   a first counter configured as a counter in operation and disposed in the first microprocessor to receive externally generated count pulses;
   a second counter is disposed in the first microprocessor and configured to undergo a test;
   a second microprocessor; and
   a test channel is configured to send an input test signal to the second counter based on test pulses from the second microprocessor,
   wherein the second microprocessor is configured to inject the input test signal to the second counter of the first microprocessor being the counter under test such that the first microprocessor and the second microprocessor are synchronized so that to coordinate a start and an end of the test, and
   wherein the first counter is driven by the externally generated count pulses to be counted while the second counter is sent the test pulses for evaluation such that the second counter is evaluated after the test pulses have been sent to determine if the second counter is operating properly.

2. The failsafe counter evaluator of claim 1, wherein once the second counter has been determined to be working properly the second counter is configured to receive same inputs as the first counter such that a count from the first counter being an active counter is transferred to the second counter being a tested counter and the count is verified to contain a same count.

3. The failsafe counter evaluator of claim 1, wherein when both the first and second counters are synchronized, the first counter is removed from counting and driven with test pulses to insure the first counter counts properly while the second counter performs a counting function.

4. The failsafe counter evaluator of claim 3, wherein once the first counter has been evaluated, the first and second counters are again synchronized and the first counter is again used for counting while the second counter is evaluated.

5. The failsafe counter evaluator of claim 4, wherein both the first and second counters are tested for proper operation in an alternate fashion while one counter is always performing a required counting function.

6. The failsafe counter evaluator of claim 4, wherein if the injected test pulses are not counted correctly a failure is indicated in the first counter being under test or in an input circuitry and the failsafe counter evaluator goes to a safe failure mode.

7. The failsafe counter evaluator of claim 1, wherein the failsafe counter evaluator is configured to perform an evaluation of the first and second counters in real time to insure that the first and second counters are performing a proper counting function without losing counts due to defects in the first and second counters.

8. The failsafe counter evaluator of claim 1, wherein the first counter is enabled for counting external events and the second counter is disabled from counting external events and counts the test pulses generated by the second microprocessor.

9. The failsafe counter evaluator of claim 8, wherein a count of the second counter is evaluated to determine if a correct number of the test pulses has been counted and if so the second counter is determined to be functioning properly.

10. The failsafe counter evaluator of claim 9, wherein upon determination that the second counter is functioning properly, the s econ d counter is switched to counting external events, and a count contained in the first counter is copied to the second counter such that both the first and second counters are synchronized and then compared to verify the count.

11. The failsafe counter evaluator of claim 10, wherein once both the first and second counters are synchronized and contain a same count, the first counter is switched to counting the test pulses and evaluated for a proper operation while the second counter is switched to counting the external events.

12. The failsafe counter evaluator of claim 1, wherein the test pulses are generated by the first microprocessor instead of the second microprocessor.

13. The failsafe counter evaluator of claim 1, wherein during a test counter inputs are effectively disconnected from physical inputs and the first microprocessor injects the test pulses into a first counter of the second microprocessor being under test.

14. The failsafe counter evaluator of claim 1, wherein the injected test pulses mimic a quadrature counter so that the first counter being under test is tested in an actual input mode.

15. The failsafe counter evaluator of claim 1, wherein the first and second microprocessors are configured to communicate to ensure that a number of injected test pulses are accurately counted by the first counter being under test.

16. A fail-safe counter evaluator to ensure proper counting, the fail-safe counter evaluator comprising:
- a first microprocessor configured to provide internally generated test pulses for evaluating counters to insure proper counting operations;
- a test channel configured to send an input test signal based on the test pulses from the first microprocessor;
- a second microprocessor;
- a second counter configured as a counter under test and disposed in the second microprocessor; and
- a first counter disposed in the second microprocessor and configured to count externally generated count pulses,
- wherein the first microprocessor is configured to inject the input test signal to the second counter being the counter under test such that the first microprocessor and the second microprocessor are synchronized so that to coordinate a start and an end of the test, and
- wherein the first counter is driven by the externally generated count pulses to be counted while the second counter is sent the test pulses for evaluation such that the second counter is evaluated after the test pulses have been sent to determine if the second counter is operating properly.

17. The failsafe counter evaluator of claim 16, wherein once the second counter has been determined to be working properly the second counter is configured to receive same inputs as the first counter such that a count from the first counter being an active counter is transferred to the second counter being a tested counter and the count is verified to contain a same count.

18. The failsafe counter evaluator of claim 16, wherein when both the first and second counters are synchronized, the first counter is removed from counting and driven with test pulses to insure the first counter counts properly while the second counter performs a counting function.

19. The failsafe counter evaluator of claim 18, wherein once the first counter has been evaluated, the first and second counters are again synchronized and the first counter is again used for counting while the second counter is evaluated.

20. The failsafe counter evaluator of claim 19, wherein both the first and second counters are tested for proper operation in an alternate fashion while one counter is always performing a required counting function.

* * * * *